United States Patent [19]

Gehring et al.

[11] Patent Number: 4,944,025
[45] Date of Patent: Jul. 24, 1990

[54] DIRECT CONVERSION FM RECEIVER WITH OFFSET

[75] Inventors: Mark R. Gehring, Portland; Richard R. Suter, Beaverton, both of Oreg.; Lawrence H. Ragan, Richardson, Tex.

[73] Assignee: AT&E Corporation, San Francisco, Calif.

[21] Appl. No.: 229,976

[22] Filed: Aug. 9, 1988

[51] Int. Cl.$^5$ .......................... H04B 1/16; H03D 3/18
[52] U.S. Cl. ..................... 455/207; 455/209; 455/264; 455/316; 329/323
[58] Field of Search .................... 455/207–209, 455/214, 47, 258, 61, 264, 316, 318, 319, 141–143, 324, 303–306, 192, 234; 329/50, 122, 124

[56] References Cited

U.S. PATENT DOCUMENTS

| | | |
|---|---|---|
| 2,928,055 | 3/1960 | Weaver, Jr. . |
| 3,961,262 | 6/1976 | Gassmann ......................... 455/207 |
| 4,462,107 | 7/1984 | Vance . |
| 4,476,585 | 10/1984 | Reed . |
| 4,521,892 | 6/1985 | Vance et al. . |
| 4,521,918 | 6/1985 | Challen . |
| 4,599,743 | 7/1986 | Reed . |
| 4,618,967 | 10/1986 | Vance et al. . |
| 4,653,117 | 3/1987 | Heck . |
| 4,672,636 | 6/1987 | Marshall et al. . |
| 4,677,690 | 6/1987 | Reed . |
| 4,736,390 | 4/1988 | Ward et al. . |

OTHER PUBLICATIONS

"Solid State Radio Engineering," Krauss et al., 1980, pp. 26–30.

Primary Examiner—Reinhard J. Eisenzopf
Assistant Examiner—Curtis Kuntz
Attorney, Agent, or Firm—Klarquist, Sparkman, Campbell, Leigh & Whinston

[57] ABSTRACT

A direct conversion FM receiver that includes AC coupling and automatic gain control employs an offset frequency at the first local oscillator. The offset frequency prevents the frequency spectrum occupied by the signal modulation from being affected by AC coupling. The offset frequency is chosen so that it translates the frequency spectrum of the received signal outside the DC notch created in the spectrum by the AC coupling. To conserve battery supplied power, an error amplifier coupled between the output of the receiver and the first local oscillator maintains the offset frequency after it has been established by a frequency synthesizer, which is then turned off.

10 Claims, 2 Drawing Sheets

DIRECT CONVERSION FM RECEIVER WITH OFFSET

BACKGROUND OF THE INVENTION

This invention relates generally to direct conversion radio receivers for frequency modulated (FM) signals and, more particularly, to a direct conversion receiver for processing analog information.

Direct conversion or "zero IF" receivers for FM signals are known in the art and are amply described in publications such as Proc. IRE 44(1956), pages 1703–1705, and U.S. Pat. No. 2,928,055, which are incorporated herein by reference. In a direct conversion receiver, a received FM signal is mixed with the output of a down conversion oscillator to translate the received signal to baseband. Equal positive and negative frequency excursions about the carrier frequency result in the same deviation frequency, but the polarity of the modulation can no longer be determined without some phase of reference. To provide that reference, two substantially identical signal paths known as I+Q paths are provided in which the received signal is down converted to baseband, low-pass filtered to remove the sum products of mixing as well as undesired adjacent channel signals, and up converted to an output frequency. The down- and up-conversion oscillators for one path are in phase quadrature with their counterparts in the other path. The two successive frequency conversions produce phase conversions between the side bands of the signals in the two paths. When the outputs of the two paths are then summed, the side bands cancel in such a manner that the modulation polarity of the original received signal is retained, though translated to a new, predetermined output frequency. In effect, the received signal is translated from an incoming frequency to baseband, filtered to remove interfering adjacent signals, and reconverted to an output frequency in which conventional FM demodulation can take place.

Direct conversion receivers have the advantage of smaller size over conventional superheterodyne receivers. A superheterodyne receiver converts an incoming radio signal to one or more intermediate frequencies in which amplification and frequency selection are more easily performed than at the frequency of the received signal. Typically, the carrier frequency of the signal is converted twice or three times in successive stages for demodulation of the signal. The intermediate frequency is selected at each stage through a bandpass filter. It has proven difficult, however, to miniaturize superheterodyne receivers because high-Q crystal or ceramic bandpass filters cannot be easily integrated in monolithic form. Direct conversion receivers, on the other hand, can be miniaturized because frequency selectivity is achieved through low-pass filtering. Low-pass filters are readily fabricated in monolithic form.

Despite this apparent advantage, direct conversion receivers have a number of drawbacks that limit their use for processing analog information. Direct conversion receivers typically include several amplifiers subject to automatic gain control (AGC). This controlled amplification preserves linearity in the intermediate frequency (IF) so that the modulated signal is accurately recovered when the two signals are recombined. DC offsets inherent in the amplifiers and other elements of the receiver circuit, however, can cause the amplifiers to saturate. One recognized method for overcoming this problem is to AC couple the receiver elements to block their DC offsets. The AC coupling, though, creates a DC notch around zero frequency that dampens the lower frequencies. The portion of the modulated signal centered around the carrier frequency is thus lost when the modulated signal is translated to the zero IF. For signal modulation formats such as FM and SSB, the DC notch causes distortion, since the notch frequencies contain signal information. Moreover, with automatic gain control, the rest of the signal is overamplified to compensate for the lost signal within the notch. This additional amplification also distorts the received signal. For these and other reasons, direct conversion receivers are primarily used for processing digital information such as with frequency shift keying (FSK), where loss of the modulated signal portion about zero frequency is not critical.

Several variations on the described direct conversion receiver design have been tried for overcoming these drawbacks to analog use. For example, U.S. Pat. No. 4,653,117 teaches placement of amplification and limiting functions outside the dual signal paths at a nonzero intermediate frequency. Gain within the signal paths is thus intentionally avoided to prevent the need for AC coupling and the resultant partial loss and distortion of the demodulated signal. DC offsets are also minimized by the use of differential circuits in the zero IF. The drawback of this approach, however, is the need for additional circuitry to provide the needed gain. The use of differential amplifiers and the addition of amplifiers and limiters beyond the summing junction of the signal paths makes the receiver circuit somewhat larger and more complex to design and fabricate.

U.S. Pat. No. 4,653,117 also mentions the possibility of AC coupling combined with translating the input signal to a small offset frequency from zero, in the range of 10 to 100 Hz, to avoid the problems of DC offset. This small translation is an attempt to fit the DC notch between the line spectra of the frequency modulated signal, each line separated by the modulating signal frequency range. This approach has several drawbacks. For one, the frequency range between line spectra is narrow and thus the notch must be placed precisely within that range. Such accuracy requires a frequency synthesizer rather than a more economical but less precise automatic frequency control (AFC). For another, the notch must be narrow. A narrow notch requires a larger coupling capacitor than required for a broader notch. Such a larger capacitor is not as easily fabricated on chip. A larger capacitor also results in a longer time constant and thus a longer turn-on time for the receiver. For receivers that must turn on and off quickly, as in time-multiplexed communication systems, turn-on and turn-off time must be extremely short. The approach disclosed in Heck, therefore, is not sufficient where turn-on time and size are considerations.

DC coupling is also employed in direct conversion receivers described in U.S. Pat. Nos. 4,599,743; 4,476,585; and 4,677,690 for processing analog information. The problem of amplified DC offsets is apparently handled by keeping the gain within the dual signal paths low. The instantaneous amplitude and phase relationship between the two signals is maintained by a voltage controlled oscillator responsive to a stabilizing network. The overall circuit is complex and hence more difficult to fabricate in monolithic form.

U.S. Pat. No. 4,736,390 discloses a zero IF receiver that attempts to reduce the effect of DC offsets by modulating the local oscillator signal with a balanced pseudo-random phase code signal. The hoped-for effect of the phase code signal is to spread the spectrum which is associated with the offset. The receiver can therefore respond to the desired signal without interference from the DC offsets.

SUMMARY OF THE INVENTION

An object of the invention, therefore, is to provide an improved direct conversion FM receiver for processing analog information which overcomes the foregoing drawbacks of the prior art.

Another object of the invention is to provide such a receiver that employs AC coupling and yet recovers the entire frequency spectrum of the modulated signal.

Another object of the invention to provide such a receiver whose local oscillator is offset a predetermined frequency from the signal carrier frequency to translate the entire frequency spectrum of the modulated signal beyond the DC notch created around zero frequency by the AC coupling.

Yet another object of the invention is to provide such a receiver which maintains the local oscillation frequency when the frequency synthesizer originally generating the frequency is temporarily turned off to conserve power.

In accordance with the invention, a direct conversion receiver includes AC coupling and employs an offset frequency at the first local oscillator to prevent the frequency spectrum occupied by the signal modulation from being affected by the AC coupling. The offset frequency is such that the modulated signal's frequency spectrum is moved entirely outside the DC notch created by the AC coupling. In the present embodiment, such an offset frequency is at least 100 kHz. To conserve battery supplied power, an automatic frequency control (AFC) maintains the offset frequency after it has been established by a frequency synthesizer, which is then turned off.

The foregoing and other objects, features, and advantages of the invention will become more apparent from the following detailed description of a preferred embodiment which proceeds with reference to the accompanying drawings.

DETAILED DESCRIPTION

Figure 1:
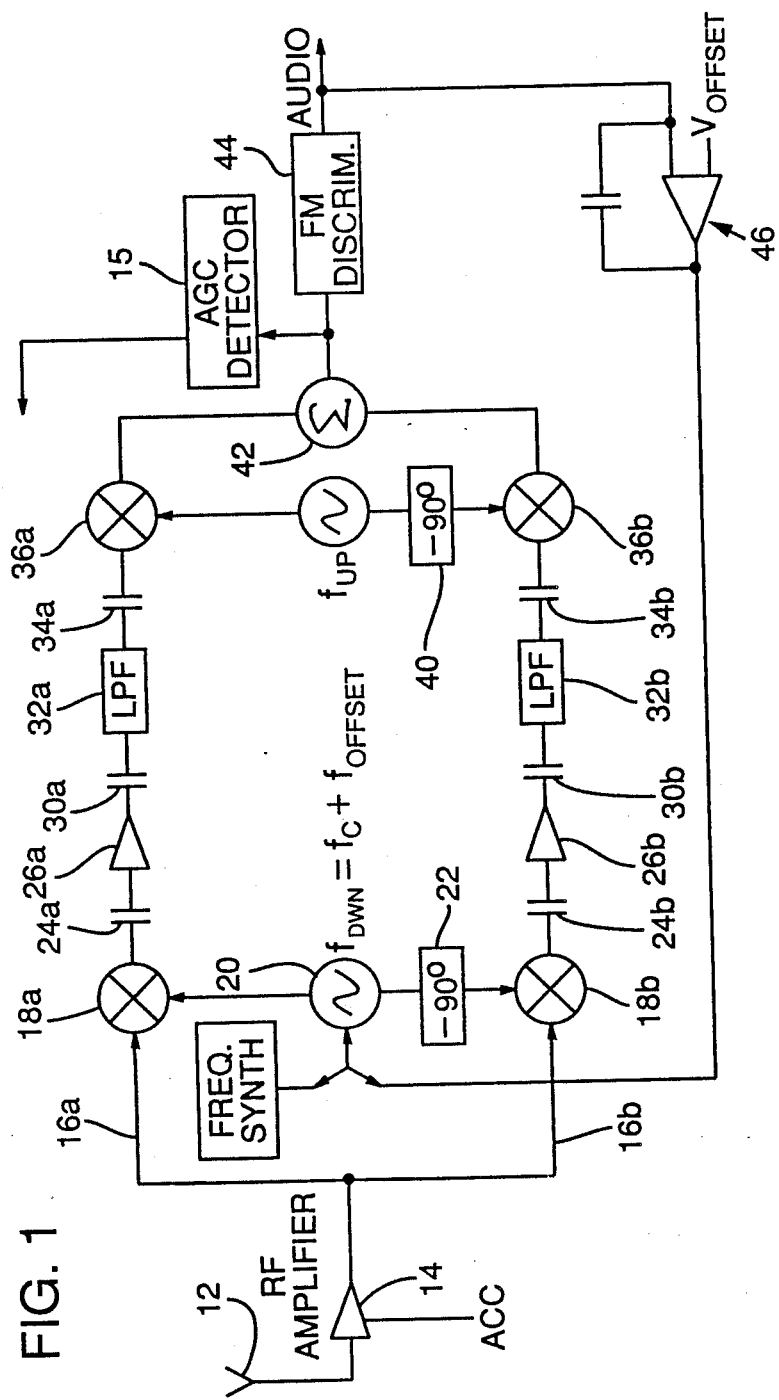
FIG. 1 is a block diagram of an FM receiver constructed in accordance with the present invention.

Referring now to the drawings, a direct conversion FM receiver circuit 10 is shown in FIG. 1 and constructed in accordance with the present invention. An incoming FM signal 12 is amplified at an AGC controlled RF amplifier 14 which provides low noise amplification that establishes the sensitivity of the receiver and maintains signal linearity. This amplifier maintains the gain at a desired level within the receiver circuit 10 in response to the gain measured by an AGC detector 15 positioned at the output junction of the signal paths 16a and 16b. The output of the preamplifier 14 is applied to each of two parallel signal paths 16a and 16b. Elements 18a and 18b in the respective paths are down conversion mixers that translate the incoming radio signal to essentially baseband. The down conversion frequency $f_{down}$ line is applied by a local oscillator 20 whose oscillator frequency is equal to the desired carrier frequency $f_c$ plus a predetermined offset $f_{offset}$ such as 100 kHz. The local oscillator 20 comprises a voltage controlled oscillator capable of being tuned or controlled over a desired band of frequencies by a conventional frequency synthesizer 21. The oscillator frequency is supplied to path 16b in quadrature using a phase shifter 22 or the equivalent to provide two signals in phase quadrature. The output of mixers 18a and 18b are routed to two identical coupling capacitors 24a and 24b. These capacitors comprise AC coupling means for blocking transmission of the DC portion of the combined signals to prevent amplification of DC offsets and saturation of the receiver circuit.

Figure 2A:
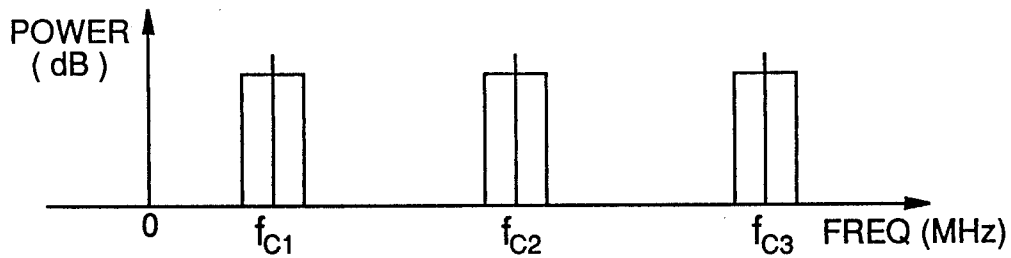
FIG. 2A illustrates the frequency spectrum for several adjacent communication channels.
Figure 2B:
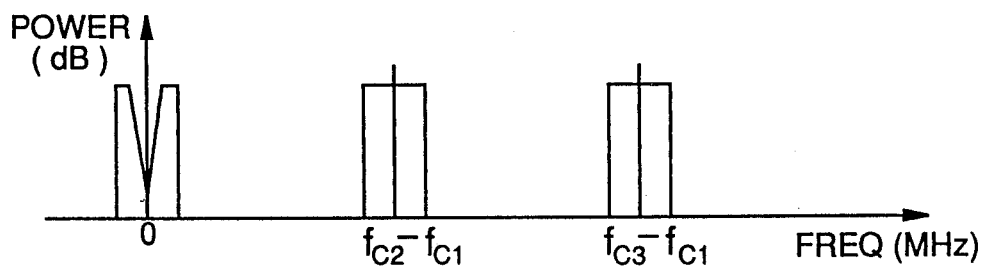
FIG. 2B illustrates the frequency spectrum for the same channels after direct conversion by the local oscillator to baseband.

FIG. 2A illustrates the significant portion of the frequency spectrum of incoming radio signals on adjacent commercial FM channels, centered about carrier frequencies $f_{c1}$, $f_{c2}$, and $f_{c3}$ that are spaced at a minimum 400 kHz apart. If the signal frequency $f_{down}$ of local oscillator 20 is set equal to the frequency of one of the channels, the received radio signal is translated to the difference frequency, zero frequency for the leftmost channel, and lower frequencies $(f_{c2}-f_{c1})$ and $(f_{c3}-f_{c1})$ for the others as illustrated in FIG. 2B. When the received signal is passed through coupling capacitors such as capacitors 24a and 24b, however, the capacitors create a DC notch shown in FIG. 2B about zero frequency and extending into the low frequency spectrum on either side of DC. The width of this notch is a function of the size of the coupling capacitors within the receiver circuit 10. The capacitors are chosen to be of a relatively small value, in the picofarad range. This small value permits their ready fabrication with the other elements of the receiver in monolithic form. The small size also is required to minimize the time constant and thus the turn-on time of the receiver because the small capacitors can be charged rapidly to their quiescent values. Such small capacitors, however, create a notch that may extend 1 to 10 kHz from each side of DC, depending on the time constant. The portion of the modulated signal carried in these lower frequencies, if not offset, is thus lost.

Figure 2C:
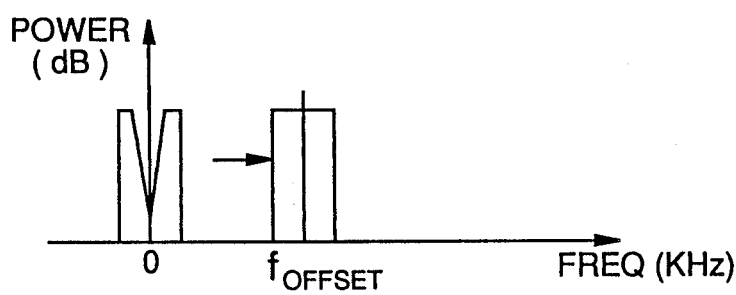
FIG. 2C illustrates the frequency spectrum of a radio signal of interest with the offset frequency added to avoid the notch due to AC coupling around the DC frequency.

To prevent this loss, the local oscillator frequency $f_{down}$ is set equal to the desired signal frequency $f_c$ plus an offset frequency $f_{offset}$. The oscillator frequency $f_{down}$ now translates the received signal to the offset frequency $f_{offset}$ as shown in the magnified graph of FIG. 2C. The offset frequency $f_{offset}$ is chosen to be sufficiently spaced from zero frequency so that the modulated signal entirely avoids the notch. At a minimum, $f_{offset}$ should be great enough to move the significant portion of the modulated signal's frequency spectrum outside the DC notch illustrated in FIG. 2B. The frequency spectrum of the received signal for audio typically has a baseband width of 80 to 90 kHz on each side of the carrier frequency. Thus, the $f_{offset}$ should be at least the width of the DC notch plus the baseband width of the modulated radio signals. In the present embodiment, an offset frequency of 100 kHz is sufficient to remove the modulated signal from the effects of the notch.

Figure 2D:
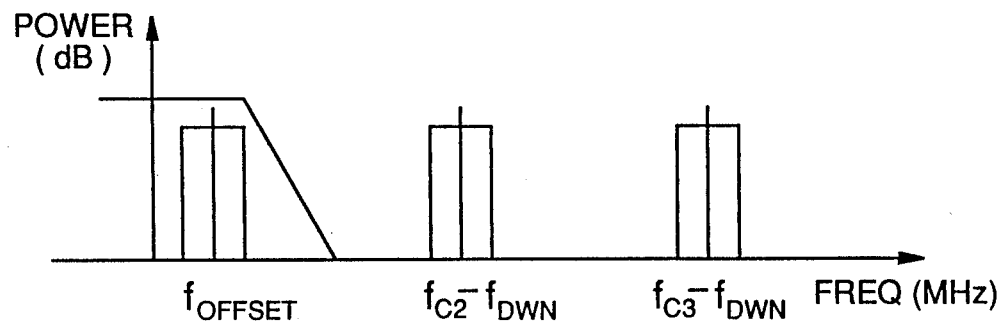
FIG. 2D illustrates the frequency spectrum for the several adjacent channels after translation and filtering.

The radio signals on paths 16a and 16b, now centered about the $f_{offset}$, are fed to the respective inputs of identical amplifiers 26a and 26b. The amplified signals are passed from the output of the amplifiers through a second pair of coupling capacitors 30a and 30b to identical low-pass filters 32a and 32b. These filters select the signals centered about the offset frequency from among the signals on adjacent channel frequencies ($f_{c2}-f_{down}$) and ($f_{c3}-f_{down}$) as illustrated in FIG. 2D. The filtered signals are then passed through coupling capacitors 34a and 34b to up-conversion mixers 36a and 36b. These mixers are supplied in phase quadrature with a frequency $f_{up}$ such as 500 kHz from a second local oscillator 38. Local oscillator 38 comprises a free running oscillator that maintains its oscillation frequency precisely without need for external control. A phase shifter 40 or equivalent provides the quadrature shift. The up-converted signals from mixers 36a and 36b are centered about 500 kHz plus $f_{offset}$, or 600 kHz in the present embodiment. The two signals in paths 16a and 16b are then summed at an element 42 such as a summing amplifier to provide the reconstructed signal at a predetermined frequency. The output of element 42 is measured by the AGC detector 15 to control the gain of amplifier 14.

Means are provided in the circuit 10 for conserving battery supplied power to the frequency synthesizer 21. The means includes an FM discriminator 44 coupled to the output element 42 and an error amplifier 46 coupled between the discriminator and the local oscillator 20. The output of the error amplifier 46 is applied to the first local oscillator 20 after the frequency synthesizer 21 has set the oscillator to the desired mixing oscillation. The frequency synthesizer is then switched off via a timer (not shown) to conserve battery power and the oscillator 20 is controlled by the output of error amplifier 46. The discriminator 44 recovers the audio signal from element 42 and also produces an automatic frequency control (AFC) error voltage. This error voltage is proportional to the deviation between the second local oscillator frequency and the signal frequency and is applied to the inverting input of the error amplifier 46. A reference voltage $V_{offset}$ proportional to the predetermined offset frequency is applied to the noninverting input of the error amplifier 46 for comparison against the error voltage. If the two voltages differ, indicating that the deviation between the filtered signal and second local oscillator frequency is greater or less than the offset frequency, the output of the error amplifier 46 changes. For example, if the error voltage is less than $V_{offset}$, then the present offset frequency is less than the predetermined frequency and the output of error amplifier 46 increases to raise the local oscillator frequency. If the error voltage exceeds $V_{offset}$, then the output of the error amplifier 46 decreases to lower the local oscillator frequency. When the difference between the error and reference voltages is zero, the output of the error amplifier 46 remains substantially constant to maintain the local oscillator frequency at the desired carrier frequency plus the offset frequency. The error amplifier 46 with the applied error and reference voltages thus maintains the predetermined offset frequency without the use of the synthesizer circuit.

Having illustrated and described the principles of the invention in a preferred embodiment, it should be apparent to those skilled in the art that the invention can be modified in arrangement and detail without departing from such principles. We claim all modifications coming within the spirit and scope of the following claims.

We claim:

1. A direct conversion receiver for processing frequency modulated radio signals that are centered about a carrier frequency, the frequency modulation extending a first sideband bandwidth above and below the carrier frequency, the receiver comprising:
   means for receiving the radio signals, said receiving means having an output;
   a pair of signal paths each having an input coupled to the output of the receiving means;
   a local oscillator tuned to a local oscillator frequency and having an output;
   each of said signal paths including a first mixer serially coupled therein, each of said first mixers having a local oscillator input coupled to the local oscillator output;
   each of said signal paths further including an AC coupling means serially coupled therein, each of said AC coupling means producing a notch centered at DC in a frequency response of each of said signal paths, said notch extending a second sideband bandwidth above and below DC;
   wherein the local oscillator frequency is set equal to the carrier frequency plus an offset frequency, said offset frequency being greater than or equal to the sum of the first and second sideband bandwidths.

2. The receiver of claim 1 including a frequency synthesizer for generating the local oscillator frequency and AFC means for maintaining the frequency when the frequency synthesizer is switched off to conserve power.

3. The receiver of claim 1 including RF amplifying means for amplifying the radio signals and automatic gain control means for controlling the gain of the RF amplifying means and thereby preserve linearity of the signals in each path.

4. The receiver of claim 1 including low-pass filter means within each path and coupled to the output of the first local oscillator for filtering the radio signals to extract signals modulated on the offset frequency.

5. The receiver of claim 1 including a second local oscillator coupled to the output of each low-pass filter means for mixing in each signal path a second oscillator frequency to convert the occupied frequency spectrum rom the offset frequency to a predetermined output frequency.

6. The receiver of claim 1 including means for shifting the first local oscillator frequency in quadrature for one of the signal paths.

7. A direct conversion receiver for processing frequency modulated radio signals that are centered about a carrier frequency, the frequency modulation extending a first sideband bandwidth above and below the carrier frequency, the receiver comprising:
   means for receiving the radio signals, said receiving means having an output;
   a pair of signal paths each having an input coupled to the output of the receiving means;
   a first local oscillator tuned to a first local oscillator frequency and having an output;
   each of said signal paths including a down conversion mixer serially coupled therein, each of said down conversion mixers having a local oscillator input;

means for coupling local oscillator signals in phase quadrature from the output of the first local oscillator to the local oscillator inputs of the down conversion mixers;

each of said signal paths further including AC coupling means serially coupled therein, each of said AC coupling means producing a notch centered at DC in a frequency response of each of said signal paths, said notch extending a second sideband bandwidth above and below DC;

said first local oscillator frequency being equal to the carrier frequency plus an offset frequency, said offset frequency being greater than or equal to the sum of the first and second sideband bandwidths;

RF amplifying means coupled to the receiving means for amplifying the radio signals and providing amplified radio signals to the pair of signal paths, said RF amplifying means thereby coupling the receiving means to the pair of signal paths;

automatic gain control means responsive to the amplified radio signals for preserving the linearity of the signals in each of said signal paths;

each of the signal paths further including a low pass filter serially coupled therein, each of said filters having an input coupled to the output of the down conversion mixer in said path, and each of said filter means having an output;

each of said signal paths further including an up conversion mixer serially coupled therein, each of said up conversion mixers having an input coupled to the output of the low pass filter in said path, and each of said up conversion mixers having an output and a second local oscillator input;

a second local oscillator tuned to a second local oscillator frequency and having an output;

means for coupling local oscillator signals in phase quadrature from the output of the second local oscillator to the second local oscillator inputs of the up conversion mixers; and means for recombining signals from each of the two signal paths to produce a frequency modulated output signal.

8. The receiver of claim 7 wherein the offset frequency is at least 100 kHz.

9. The receiver of claim 7 including a frequency synthesizer for generating the first local oscillator frequency and AFC means for maintaining the frequency when the frequency synthesizer is switched off to conserve power.

10. A direct conversion receiver for processing frequency modulated radio signals that are centered about a carrier frequency, the frequency modulation extending a first sideband bandwidth above and below the carrier frequency, the receiver comprising:

means for receiving the radio signals, said receiving means having an output;

a pair of signal paths each having an input coupled to the output of the receiving means;

a voltage controlled local oscillator responsive to a voltage applied to an input thereof for producing a local oscillator frequency, said oscillator having an output;

each of said signal paths including a first mixer serially coupled therein, each of said first mixers having a local oscillator input coupled to the local oscillator output;

each of said signal paths further including an AC coupling means serially coupled therein, each of said AC coupling means producing a notch centered at DC in a frequency response of each of said signal paths, said notch extending a second sideband bandwidth above and below DC;

a synthesizer for generating a voltage corresponding to a desired frequency;

switch means operable in a first position for applying the voltage generated by the synthesizer to the input of the voltage controlled oscillator;

said switch means operable in a second position for applying a voltage from an AFC circuit the input of the voltage controlled oscillator;

wherein the synthesizer can be switched off to conserve power and control of the local oscillator frequency can be assumed by switching the input of the voltage controlled oscillator to the AFC circuit.

* * * * *

UNITED STATES PATENT AND TRADEMARK OFFICE
CERTIFICATE OF CORRECTION

PATENT NO. : 4,944,025

DATED : July 24, 1990

INVENTOR(S) : Mark R. Gehring, Richard R. Suter, Lawrence H. Ragan

It is certified that error appears in the above-identified patent and that said Letters Patent is hereby corrected as shown below:

Column 7, line 5 "including AC" should read -- including an AC--.

Signed and Sealed this

Fourth Day of February, 1992

Attest:

HARRY F. MANBECK. JR.

Attesting Officer

Commissioner of Patents and Trademarks